(12) United States Patent
Takano et al.

(10) Patent No.: US 10,321,578 B2
(45) Date of Patent: Jun. 11, 2019

(54) FILLING METHOD OF CONDUCTIVE PASTE AND MANUFACTURING METHOD OF MULTI-LAYER PRINTED CIRCUIT BOARD

(71) Applicant: Nippon Mektron, Ltd., Tokyo (JP)

(72) Inventors: Shoji Takano, Tokyo-To (JP); Fumihiko Matsuda, Tokyo-To (JP)

(73) Assignee: NIPPON MEKTRON, LTD., Tokyo (JP)

( * ) Notice: Subject to any disclaimer, the term of this patent is extended or adjusted under 35 U.S.C. 154(b) by 0 days.

(21) Appl. No.: 14/892,345

(22) PCT Filed: Nov. 10, 2014

(86) PCT No.: PCT/JP2014/079754
§ 371 (c)(1),
(2) Date: Nov. 19, 2015

(87) PCT Pub. No.: WO2015/072431
PCT Pub. Date: May 21, 2015

(65) Prior Publication Data
US 2016/0095227 A1    Mar. 31, 2016

(30) Foreign Application Priority Data
Nov. 12, 2013   (JP) .................................. 2013-234267

(51) Int. Cl.
*B29C 31/04*   (2006.01)
*H05K 3/00*   (2006.01)
(Continued)

(52) U.S. Cl.
CPC ........... *H05K 3/101* (2013.01); *B23K 3/0638* (2013.01); *B29C 31/041* (2013.01);
(Continued)

(58) Field of Classification Search
CPC ...... H05K 3/0094; H05K 3/101; H05K 3/107; H05K 3/1225; H05K 3/1216;
(Continued)

(56) References Cited

U.S. PATENT DOCUMENTS 3,825,643 A * 7/1974 Hillier et al. ........... B29C 67/08
264/161
5,238,381 A * 8/1993 Rankin, II .......... B29C 45/7613
264/410
(Continued)

FOREIGN PATENT DOCUMENTS

CN    100354125 C    12/2007
CN    103258786 A    8/2013
(Continued)

OTHER PUBLICATIONS

Machine translation of Japanese Patent Publication No. JP 2003-037360A, originally published Feb. 7, 2003.*
(Continued)

*Primary Examiner* — William P Bell
(74) *Attorney, Agent, or Firm* — Jacobson Holman, PLLC.

(57) ABSTRACT

A filling method of conductive paste includes a step of providing a protective film on a principal surface of a metal foil clad laminated sheet, a step of forming bottomed via holes, a step of removing the film from a surface to a midway thereof to form a conductive paste flowing groove having the via holes, a step of disposing a housing member on the film, and thereby, causing a conductive paste injecting channel and a vacuum evacuating channel to communicate with a conductive paste flowing space S, a step of depressurizing the space S via the channel, and a step of injecting
(Continued)

conductive paste into the space S via the channel, and thereby, filling an inside of the via holes with the conductive paste.

8 Claims, 10 Drawing Sheets

(51) Int. Cl.
| | |
|---|---|
| *H05K 3/10* | (2006.01) |
| *B23K 3/06* | (2006.01) |
| *B29C 33/00* | (2006.01) |
| *H05K 3/40* | (2006.01) |
| *H05K 3/46* | (2006.01) |
| *B29C 45/26* | (2006.01) |
| *B29C 45/00* | (2006.01) |
| *H05K 1/09* | (2006.01) |

(52) U.S. Cl.
CPC ....... *B29C 33/0022* (2013.01); *H05K 3/0014* (2013.01); *H05K 3/0044* (2013.01); *H05K 3/0094* (2013.01); *H05K 3/4038* (2013.01); *H05K 3/4069* (2013.01); *H05K 3/4611* (2013.01); *H05K 3/4635* (2013.01); *B29C 2045/0089* (2013.01); *B29C 2045/2691* (2013.01); *H05K 1/09* (2013.01); *H05K 3/005* (2013.01); *H05K 2201/0141* (2013.01); *H05K 2201/0145* (2013.01); *H05K 2201/0154* (2013.01); *H05K 2201/0355* (2013.01); *H05K 2201/09509* (2013.01); *H05K 2201/09563* (2013.01); *H05K 2203/0264* (2013.01); *H05K 2203/0568* (2013.01); *H05K 2203/1178* (2013.01); *H05K 2203/1461* (2013.01)

(58) Field of Classification Search
CPC .............. H05K 3/1226; H05K 3/1258; B29C 33/0022; B29C 33/0027; B29C 33/0055; B29C 33/10; B29C 45/2669; B29C 45/7613; B29C 2045/14959; B29C 31/042; B29C 31/044; B29C 31/045; B29C 33/0061; B29C 2045/0089; B29C 41/36; B29C 67/08; B29C 31/041; B29C 47/0866; B29C 33/0066; B29C 2033/0094; B29C 45/0081; B29C 2045/2691; B29C 31/04; H01L 21/7688; B05C 5/0216; B05C 17/06; B41N 1/24; B41N 1/248; B23K 3/0638
See application file for complete search history.

(56) References Cited

U.S. PATENT DOCUMENTS

| | | | | |
|---|---|---|---|---|
| 6,115,911 A * | 9/2000 | Liaw | .................... | H05K 3/0094 |
| | | | | 174/262 |
| 6,193,910 B1 * | 2/2001 | Ikai | ........................ | H01B 1/22 |
| | | | | 252/512 |
| 6,231,333 B1 * | 5/2001 | Gruber | ................. | B23K 3/0607 |
| | | | | 118/256 |
| 6,440,542 B1 * | 8/2002 | Kariya | ................. | H05K 3/0035 |
| | | | | 174/259 |
| 2001/0027842 A1* | 10/2001 | Curcio | ................. | H01L 21/486 |
| | | | | 156/293 |
| 2002/0175438 A1* | 11/2002 | Gruber | ................. | H01L 21/486 |
| | | | | 264/102 |
| 2003/0000084 A1* | 1/2003 | Bourrieres | ................ | B05C 3/18 |
| | | | | 29/852 |
| 2003/0066572 A1 | 4/2003 | Sakaida et al. | | |
| 2006/0102386 A1* | 5/2006 | Morimoto | ............ | H05K 3/4046 |
| | | | | 174/260 |
| 2008/0070011 A1 | 3/2008 | Oh et al. | | |
| 2009/0039140 A1* | 2/2009 | Bezama | ............... | B23K 3/0638 |
| | | | | 228/41 |
| 2013/0161870 A1* | 6/2013 | Manigatter | .......... | B29C 45/322 |
| | | | | 264/297.8 |
| 2013/0216699 A1 | 8/2013 | Yamaguchi et al. | | |
| 2014/0093643 A1* | 4/2014 | Li | ........................ | B05C 5/0216 |
| | | | | 427/238 |

FOREIGN PATENT DOCUMENTS

| | | | | |
|---|---|---|---|---|
| DE | 3630211 A1 * | 7/1987 | ......... | B29C 33/0011 |
| JP | 6-91701 A | 4/1994 | | |
| JP | 3092348 B2 * | 9/2000 | ......... | B29C 45/2701 |
| JP | 2002-217509 | 8/2002 | | |
| JP | 2003-037360 | 2/2003 | | |
| JP | 2003-182023 | 7/2003 | | |
| JP | 2007-096121 | 4/2007 | | |
| JP | 2008-078657 | 4/2008 | | |
| JP | 2010-228104 | 10/2010 | | |
| JP | 2011-066293 | 3/2011 | | |
| JP | 2013-171862 | 9/2013 | | |
| TW | 201318867 A1 | 5/2013 | | |

OTHER PUBLICATIONS

Machine translation of German Patent Publication No. DE-3630211A1, originally published Jul. 1987, 6 pages (Year: 1987).*
Taiwanese Office Action, dated Aug. 10, 2016; with English Translation (20 pages).
International Search Report dated Feb. 3, 2015.
Chinese Office Action, dated Jul. 18, 2017, with English Translation (13 pages).

* cited by examiner

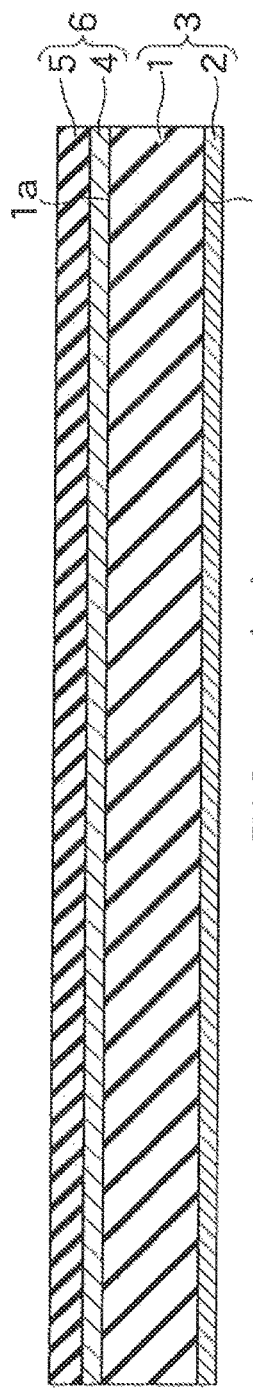
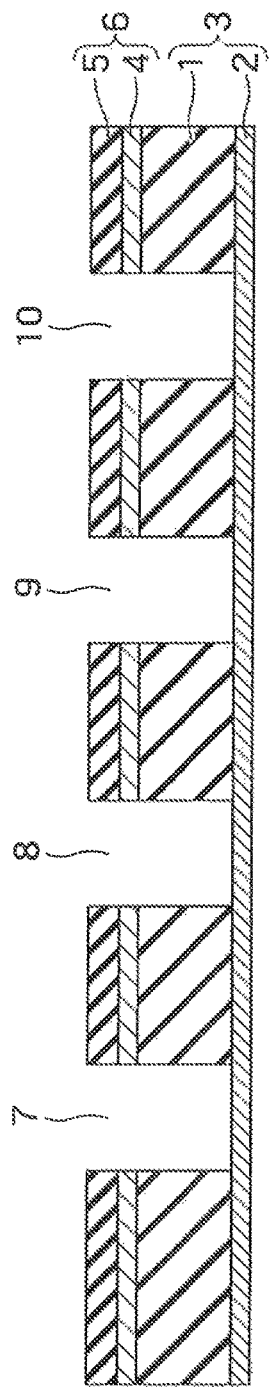
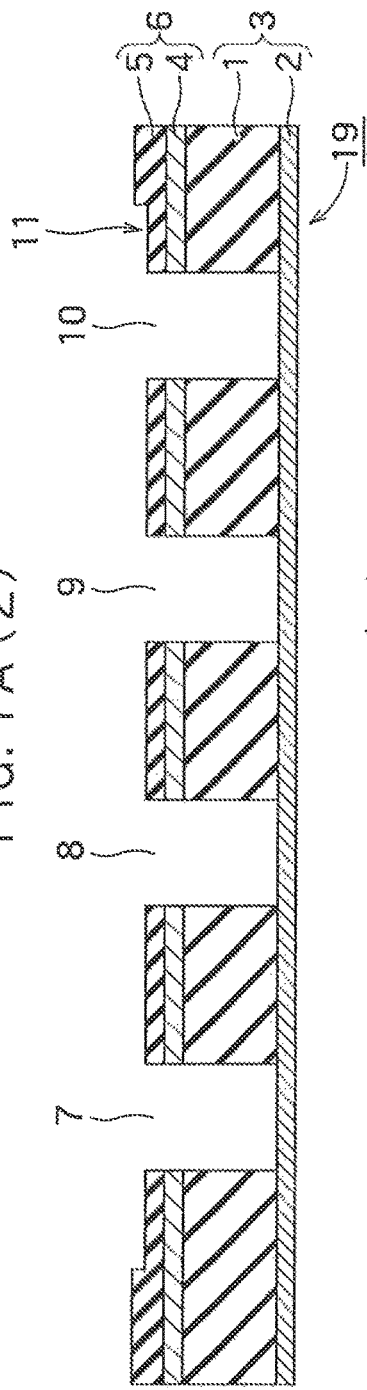
FIG. 1A(1)    FIG. 1A(2)    FIG. 1A(3)

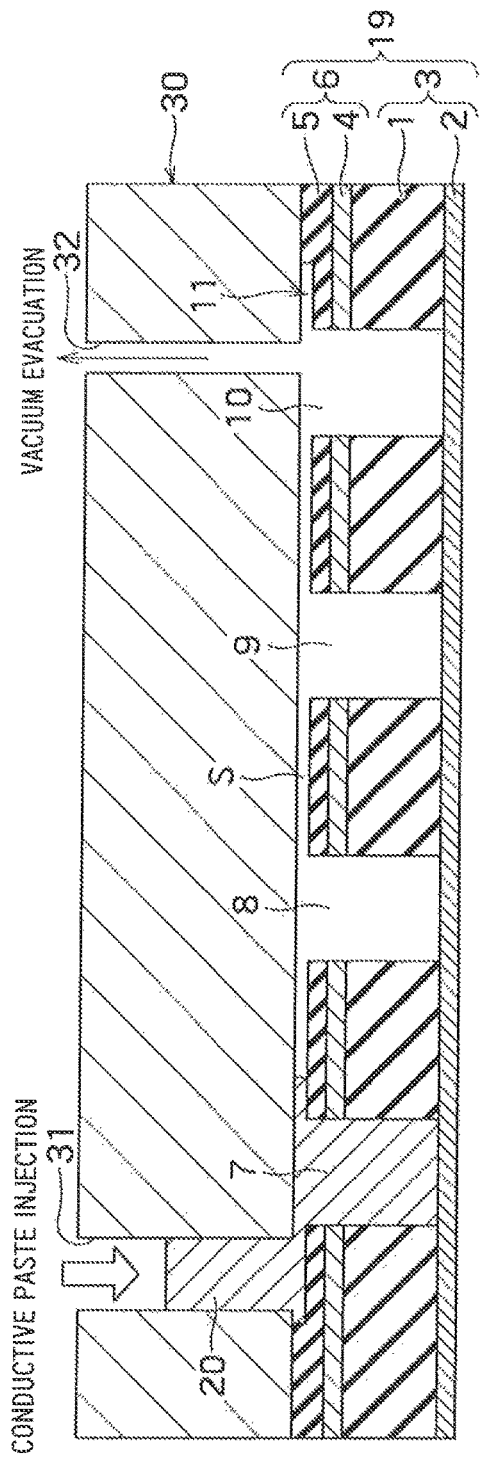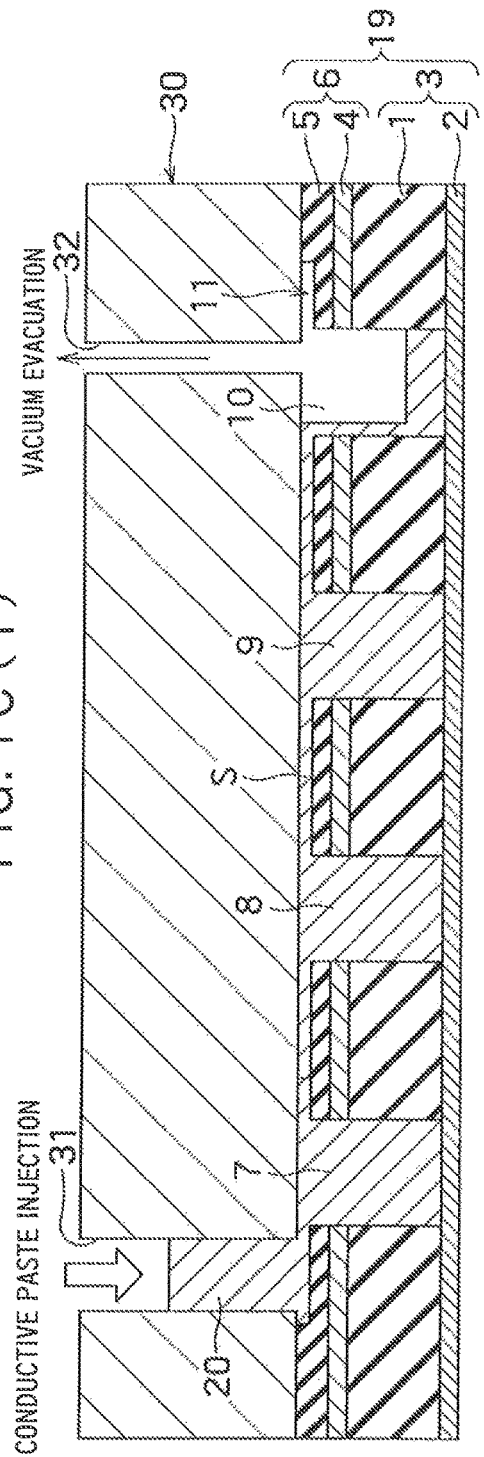
FIG. 1C(1)
FIG. 1C(2)

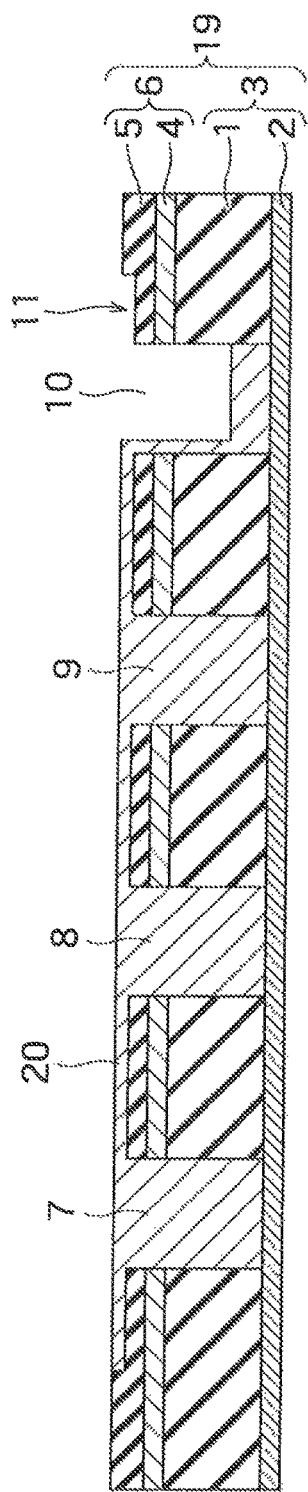
FIG. 1D (1)
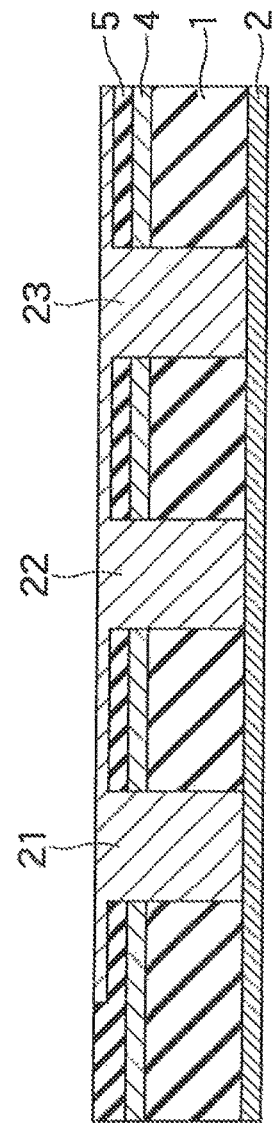
FIG. 1D (2)
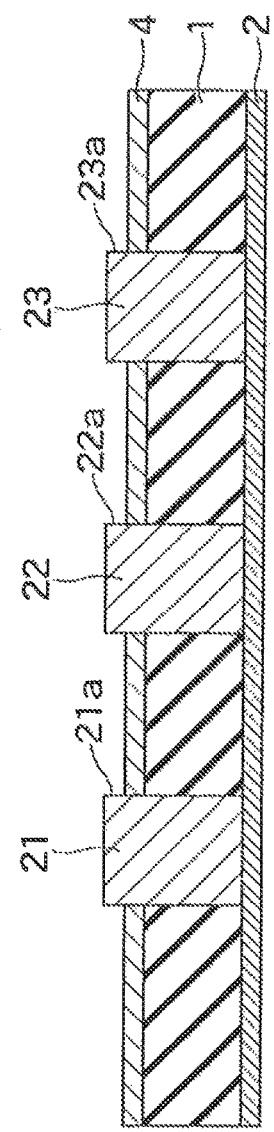
FIG. 1D (3)

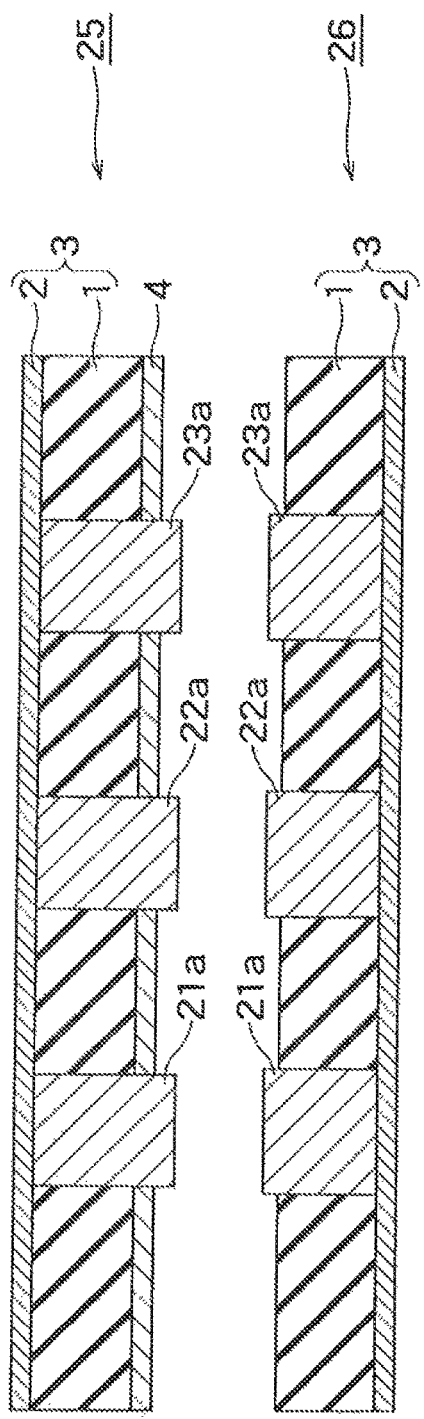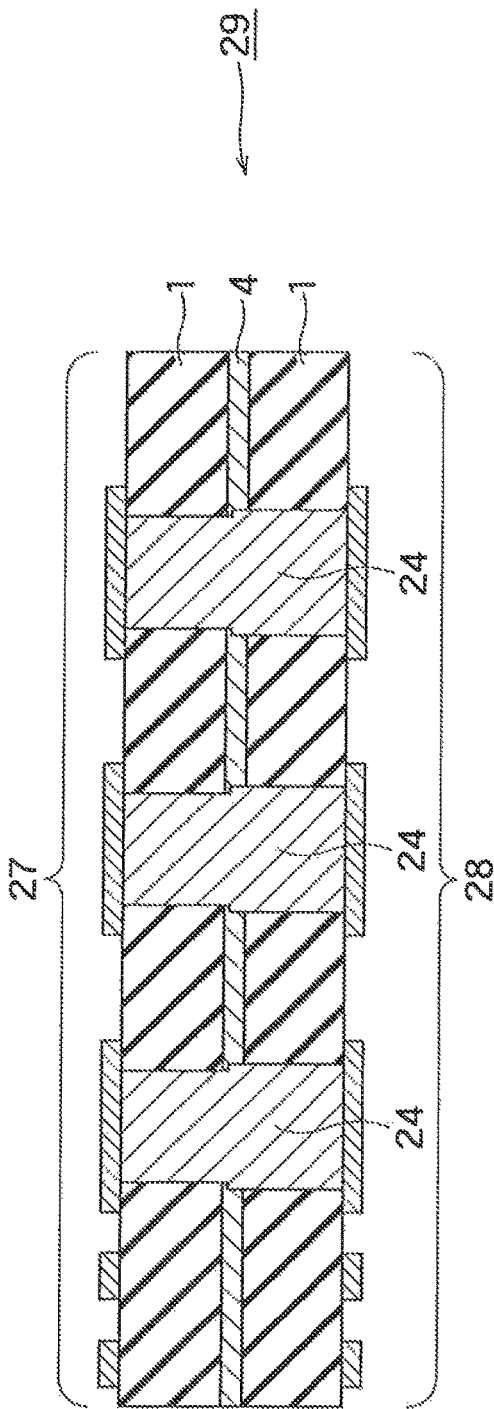
FIG. 1E (1)
FIG. 1E (2)

FILLING METHOD OF CONDUCTIVE PASTE AND MANUFACTURING METHOD OF MULTI-LAYER PRINTED CIRCUIT BOARD

TECHNICAL FIELD

The present invention relates to a filling method of conductive paste and a manufacturing method of a multi-layer printed circuit board, and more specifically, a method of filling a bottomed via hole (conduction hole which is not penetrated) of a printed circuit board with conductive paste, and a manufacturing method of a multi-layer printed circuit board using the relevant method.

BACKGROUND ART

Developing small electronic devices with high functionality is requiring a high-density printed circuit board. To respond to the request, a multi-layer printed circuit board having a plurality of printed circuit boards laminated is being developed.

Moreover, in recent years, the amount of information which an electronic device such as a notebook-type personal computer, a digital camera, a mobile communication device and a game machine handles is largely increasing with a tendency of faster and faster signal transmission rate. For example, in the case of personal computers, the transmission rate was moving to the transmission standard with 6 Gbps of transmission rate from year 2010 to year 2011. Due to this, in designing a printed circuit board, it is important more and more for signal loss on the transmission line to be taken into consideration.

To be compatible with further increasing signal rate and longer transmission line, it is discussed that liquid crystal polymer (LCP) is applied to the insulative layer of the flexible printed circuit board. Since the liquid crystal polymer has low dielectric constant and dielectric tangent (tan δ), allowing small dielectric loss, the transmission loss can be reduced.

However, the liquid crystal polymer has a larger coefficient of thermal expansion in the thickness direction as compared with an insulative material used for the conventional flexible printed circuit board (polyimide or the like). Due to this, it has a large difference in coefficient of thermal expansion from plated through holes conventionally typically used for inter-layer connection paths, which causes a concern that connection reliability with respect to a temperature cycle and the like cannot be sufficiently secured. As the liquid crystal polymer layer is made thicker in order to reduce the transmission loss, the connection reliability is more difficult to be secured.

Therefore, in place of the plated through holes, it is proposed that the inter-layer connection is made with conduction vias formed by filling bottomed via holes with conductive paste (Patent Literature 1 and Patent Literature 2).

Moreover, in view of preventing air voids from entering the conductive paste, it is described that bottomed via holes are filled with conductive paste using a vacuum printer (Patent Literature 3 and Patent Literature 4).

The vacuum printer vacuum-evacuates the entire system including a base material as a printing target (boring base material in which the bottomed via holes are formed), a printing plate, a squeegee and the like. After that, it scans the squeegee to fill the inside of the bottomed via holes with the conductive paste. In this stage, there can be a case where gaps (voids) which are not filled with the conductive paste arise in the bottomed via holes. Since the gaps are mostly in a vacuum state, the gaps are eliminated by releasing the system to the atmospheric pressure after completion of the printing.

In this way, to print the conductive paste under the vacuum environment can prevent the so-called air voids from arising in the conductive paste.

CITATION LIST

Patent Literature

Patent Literature 1: Japanese Patent Laid-Open No. 2011-66293
Patent Literature 2: Japanese Patent Laid-Open No. 2007-96121
Patent Literature 3: Japanese Patent Laid-Open No. 2002-217509
Patent Literature 4: Japanese Patent Laid-Open No. 2008-78657

SUMMARY OF INVENTION

Technical Problem

However, the vacuum printer has a larger-scale vacuum evacuation system, which causes a high cost for its introduction. Furthermore, the printing process using the vacuum printer needs evacuation and release to the air for the entire system every time of the printing, taking a relatively longer time.

As described above, conventionally, the filling of the bottomed via holes with the conductive paste results in problematically low productivity since it needs an expensive vacuum printer, and in addition to this, the filling with the conductive paste takes a relatively longer time caused by evacuation and release to the air for the entire system.

Therefore, an object of the present invention is to provide a filling method of conductive paste capable of preventing air voids from entering the conductive paste with which the inside of bottomed via holes is filled, reducing manufacturing costs and improving productivity, and a manufacturing method of a multi-layer printed circuit board using the relevant filling method of conductive paste.

Solution to Problem

There is provided a filling method of conductive paste according to one aspect of the present invention, including a process of preparing a metal foil clad laminated sheet having an insulative base material having a first principal surface and a second principal surface opposite to the first principal surface and a metal foil provided on the second principal surface of the insulative base material, a process of providing a protective film on the first principal surface of the metal foil clad laminated sheet, a boring process of partially removing the protective film and the insulative base material, and thereby, forming a bottomed via hole having the metal foil exposed on its bottom face, a groove forming process of removing the protective film from a surface to a midway thereof to form a conductive paste flowing groove having the bottomed via hole exposed on its bottom face, a housing member preparing process of preparing a housing member which is a housing member in which a conductive paste injecting channel and a vacuum evacuating channel are provided and has an opening face on which one end of each of the conductive paste injecting channel and the vacuum evacuating channel opens, a housing member disposing process of disposing the housing member on the protective film such that the opening face opposes the protective film, and thereby, causing the conductive paste injecting channel and the vacuum evacuating channel to communicate with a conductive paste flowing space defined by the bottomed via hole, the conductive paste flowing groove and the opening face of the housing member, a process of depressurizing the conductive paste flowing space via the vacuum evacuating channel, and a filling process of injecting conductive paste into the conductive paste flowing space via the conductive paste injecting channel, and thereby, filling an inside of the bottomed via hole with the conductive paste.

There is provided a manufacturing method of a multi-layer printed circuit board according to one aspect of the present invention, including a process of preparing first and second wiring base materials each of which is obtained by filling the bottomed via hole formed in the metal foil clad laminated sheet with the conductive paste using the filling method of conductive paste, a process of peeling off the protective film of the first wiring base material such that an adhesive layer which the protective film has remains in the first wiring base material, to cause part of the conductive paste with which the bottomed via hole is filled to protrude, a process of peeling off the protective film of the second wiring base material along with an adhesive layer with slight adhesion which the protective film has to cause part of the conductive paste with which the bottomed via hole is filled to protrude, and an integrating process of laminating the first and second wiring base materials such that projecting parts of the conductive paste of these come into contact with each other, and heating the laminated first and second wiring base materials to be integrated.

Advantageous Effects of Invention

In the present invention, the housing member is disposed on the protective film, and the conductive paste is injected into the conductive paste flowing space via the conductive paste injecting channel of the housing member in the state where the conductive paste flowing space defined by the bottomed via hole, the conductive paste flowing groove, and the opening face of the housing member, is depressurized.

Therefore, according to the present invention, since the conductive paste flowing space is depressurized, air voids can be prevented from entering the conductive paste with which the inside of the bottomed via hole is filled.

Furthermore, according to the present invention, since only the conductive paste flowing space is sufficient to be locally depressurized, a vacuum printer is not needed, which can reduce manufacturing costs.

Moreover, according to the present invention, since only the conductive paste flowing space is sufficient to be locally depressurized, time required for the depressurizing process can be largely reduced, which can improve productivity.

BRIEF DESCRIPTION OF DRAWINGS

FIG. 1A illustrates process cross-sectional views for explaining a manufacturing method of a multi-layer printed circuit board according to an embodiment of the present invention.

FIG. 1C illustrates process cross-sectional views for explaining the manufacturing method of a multi-layer printed circuit board according to the embodiment of the present invention succeeding from FIG. 1B(a).

FIG. 1D illustrates process cross-sectional views for explaining the manufacturing method of a multi-layer printed circuit board according to the embodiment of the present invention succeeding from FIG. 1C.

FIG. 1E illustrates process cross-sectional views for explaining the manufacturing method of a multi-layer printed circuit board according to the embodiment of the present invention succeeding from FIG. 1D.

DESCRIPTION OF EMBODIMENTS

Figure 1B:
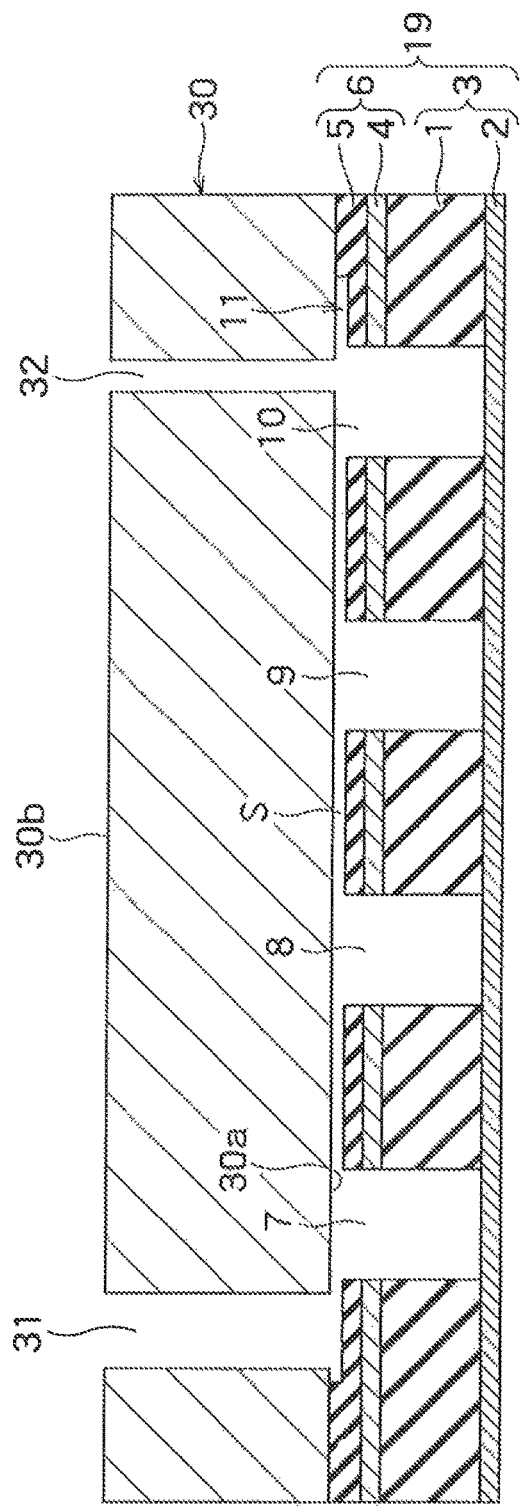
FIG. 1B(a) is a process cross-sectional view for explaining the manufacturing method of a multi-layer printed circuit board according to the embodiment of the present invention succeeding from FIG. 1A, and FIG. 1B(b) is a partial plan view of a housing member 30 in the state where the housing member 30 is disposed on a protective film 6.
Figure 1B:
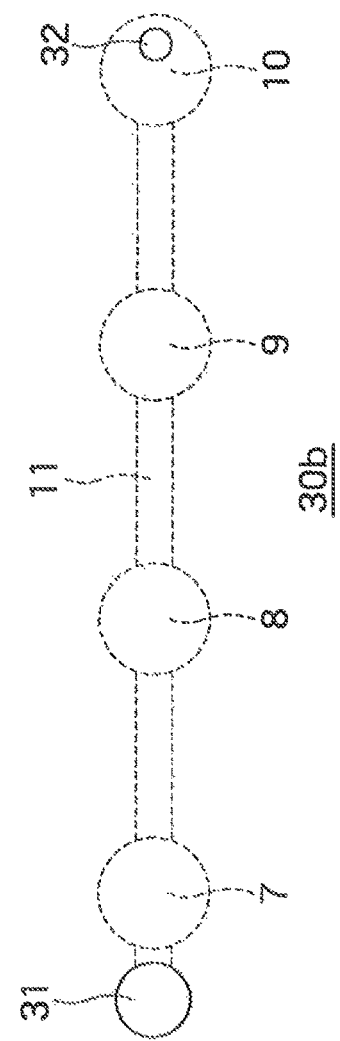

Hereafter, embodiments of the present invention are described with reference with the drawings. Notably, the constituents having the same functions in the figures are given the same signs, and the detailed description of the constituents with the same signs is not repeated. Moreover, the drawings are schematic and primarily illustrate the characteristic parts of the embodiments of the present invention. Relations between thicknesses and planar dimensions, ratios between thicknesses of layers, and the like are scaled differently from the reality.

An embodiment of the present invention is described with reference to FIG. 1A to FIG. 1E and FIG. 2. FIG. 1A to FIG. 1E are process cross-sectional views for explaining a manufacturing method of a multi-layer printed circuit board according to the present embodiment. FIG. 2(a) is a plan view of a housing member 30 used for filling bottomed via holes with conductive paste. FIG. 2(b) is a cross-sectional view taken along the line A-A in FIG. 2(a).

First, as illustrated in FIG. 1A(1), a metal foil clad laminated sheet 3 having an insulative base material 1 having a principal surface 1a and a principal surface 1b opposite to the principal surface 1a and a metal foil 2 provided on the principal surface (lower face) 1b of the insulative base material 1 is prepared.

The metal foil clad laminated sheet 3 is, for example, a single-sided copper clad laminated sheet. In this case, the insulative base material 1 is a flexible insulative film (for example, with a thickness of 100 μm) made of liquid crystal polymer (LCP), polyimide, polyethylene terephthalate (PET) or the like. The metal foil 2 is a copper foil (for example, with a thickness of 12 µm). Notably, the metal foil 2 may also be made of metal (silver, aluminum or the like) other than copper.

Notably, the insulative base material 1 may also be an insulative substrate for a rigid printed circuit board such as glass epoxy substrate, not limited to the insulative film.

Next, as illustrated in FIG. 1A(1), a protective film 6 is provided on the principal surface 1a of the metal foil clad laminated sheet 3. The protective film 6 has an adhesive layer 4 and an insulative film 5.

The protective film 6 is provided by laminating the adhesive layer 4 (for example, low flow bonding sheet with a thickness of 15 µm) on the principal surface 1a of the insulative base material 1, and after that, pasting the insulative film 5 (for example, PET with a thickness of 25 µm) on the adhesive layer 4. As another method, the protective film 6 having the adhesive layer 4 provided on one surface of the insulative film 5 may also be prepared to paste the protective film 6 on the insulative base material 1.

In any of the above-mentioned methods, when the adhesive layer 4 or the protective film 6 having the adhesive layer 4 provided on one surface of the insulative film 5 is laminated, the laminating is needed to be performed at a lower temperature than the thermosetting temperature of the adhesive layer 4 such that adhesiveness remains which is required for causing the wiring base materials to adhere to each other in an integrating process mentioned later.

Next, as illustrated in FIG. 1A(2), the protective film 6 and the insulative base material 1 are partially removed, and thereby, the bottomed via holes 7, 8 and 9 having the metal foil 2 exposed on their bottom faces are formed (boring process). The diameter of the bottomed via holes 7, 8 and 9 is, for example, φ150 µm to 200 µm.

Notably, the number of the bottomed via holes formed in the boring process is not limited to three but is arbitrary.

Moreover, in boring process, as illustrated in FIG. 1A(2), the protective film 6 and the insulative base material 1 are partially removed, and thereby, a dummy bottomed via hole 10 may also be formed. For example, the dummy bottomed via hole 10 is formed in a region which is finally discarded by outline processing or the like.

In the state where the housing member 30 mentioned later is disposed on the protective film 6, the dummy bottomed via hole 10 communicates with a conductive paste flowing space S, and is positioned between the bottomed via hole 9 and the vacuum evacuating channel 32 of the housing member 30. The bottomed via hole 9 is the bottomed via hole closest to the vacuum evacuating channel 32 among the bottomed via holes 7, 8 and 9.

A plurality of the dummy bottomed via holes 10 may also be formed. The dummy bottomed via holes 10 are continuously provided and connected with a conductive paste flowing groove 11 mentioned later.

The dummy bottomed via hole 10 may also be formed in a process other than the boring process in which the bottomed via holes 7, 8 and 9 are formed. The dummy bottomed via hole 10 does not necessarily have the metal foil 2 exposed on its bottom face.

Next, as illustrated in FIG. 1A(3), the protective film 6 is removed from a surface to a midway thereof, and thereby, the conductive paste flowing groove 11 having the bottomed via holes 7, 8 and 9 exposed on its bottom face is formed (groove forming process). The conductive paste flowing groove 11 is a groove joining the bottomed via holes 7, 8 and 9. Notably, the depth of the conductive paste flowing groove 11 is, for example, 10 µm to 15 µm. The width of the conductive paste flowing groove 11 is, for example, 100 µm.

Through the boring process and the groove forming process, a boring base material 19 illustrated in FIG. 1A(3) is obtained.

When the plurality of bottomed via holes are formed, the conductive paste flowing groove 11 is formed so as to join the plurality of bottomed via holes 7, 8 and 9 (refer to FIG. 1B(b) mentioned later). Each of the bottomed via holes 7, 8 and 9 is not needed to be exposed on the entirety of the bottom face of the conductive paste flowing groove 11.

Preferably, the bottomed via holes 7, 8 and 9, the dummy bottomed via hole 10 and the conductive paste flowing groove 11 are formed by laser processing. In this case, in view of processing workability, an infrared laser such as a carbon dioxide gas laser is preferably used. Nevertheless, another laser such as a UV-YAG laser may also be used.

When a carbon dioxide gas laser is used, its beam diameter is allowed to be substantially equal to a desired hole diameter of the bottomed via holes 7, 8 and 9 in forming the bottomed via holes 7, 8 and 9. The beam diameter is allowed to be substantially equal to a desired width of the conductive paste flowing groove 11 in forming the conductive paste flowing groove 11.

Herein, a carbon dioxide gas laser processing machine (ML605GTXIII-5100U2), Mitsubishi Electric Corporation, was used. In forming the bottomed via holes 7, 8 and 9, the beam diameter was adjusted to be 150 µm with a predetermined aperture or the like, and one bottomed via hole was formed by 5 shots thereof with 10 µsec of pulse width and 5 mJ of energy per one pulse. In forming the conductive paste flowing groove 11, the beam diameter was adjusted to be 100 µm with a predetermined aperture or the like, and the conductive paste flowing groove 11 was formed by performing scanning at 50 µm of pitch such that the beam was overlapping by substantially a half thereof with 5 µsec of pulse width and 3 mJ of energy per one pulse.

When any of the bottomed via holes 7, 8 and 9 and the conductive paste flowing groove 11 is formed, the transmission frequency of the laser can be changed from 1 kHz to 5 kHz. The drawing speed of the laser is 50 mm/s in the case of 1 kHz and 250 mm/s in the case of 5 kHz. Due to this, processing time required for the formation of the conductive paste flowing groove 11 is seconds or less at most. Accordingly, the formation of the conductive paste flowing groove 11 does not almost affect productivity of the printed circuit board.

After the irradiation with the laser pulses, desmear processing is performed to remove resin residue in the boundary between the insulative base material 1 and the metal foil 2 and a processing film on the backside of the metal foil 2. Herein, the processing film on the backside of the metal foil 2 is a film provided in manufacturing the metal foil clad laminated sheet 3 (for example, a Ni/Cr film) for the purpose that close contact of the metal foil 2 such as a copper foil with the insulative base material 1 is improved and for the like.

Next, the housing member 30 is prepared (housing member preparing process).

As illustrated in FIGS. 2(a) and 2(b), a conductive paste injecting channel 31 and a vacuum evacuating channel 32 are provided in the housing member 30. The housing member 30 has an opening face 30a on which one end of each of the conductive paste injecting channel 31 and the vacuum evacuating channel 32 opens.

For example, the housing member 30 is a plate-shaped member as illustrated in FIGS. 2(a) and 2(b). In this case, the conductive paste injecting channel 31 and the vacuum evacuating channel 32 are respectively provided as a conductive paste injecting hole and a vacuum evacuating hole each of which penetrates the plate-shaped housing member 30 in the thickness direction. The other end of each of the conductive paste injecting channel 31 and the vacuum evacuating channel 32 opens on an upper face 30b of the housing member 30.

Notably, the conductive paste injecting channel 31 and the vacuum evacuating channel 32 are not limited to the straight through holes as mentioned above, but may also be channels bending into L-shapes or the like. For example, the other end of each of the conductive paste injecting channel 31 and/or the vacuum evacuating channel 32 may also open on a lateral face 30c of the housing member 30.

Moreover, the shape of the housing member 30 is not limited to a plate-shape as long as it has the planar opening face 30a.

Moreover, the housing member 30 is preferably made of metal (aluminum, stainless steel or the like) in view of securing rigidity.

Figure 2A:
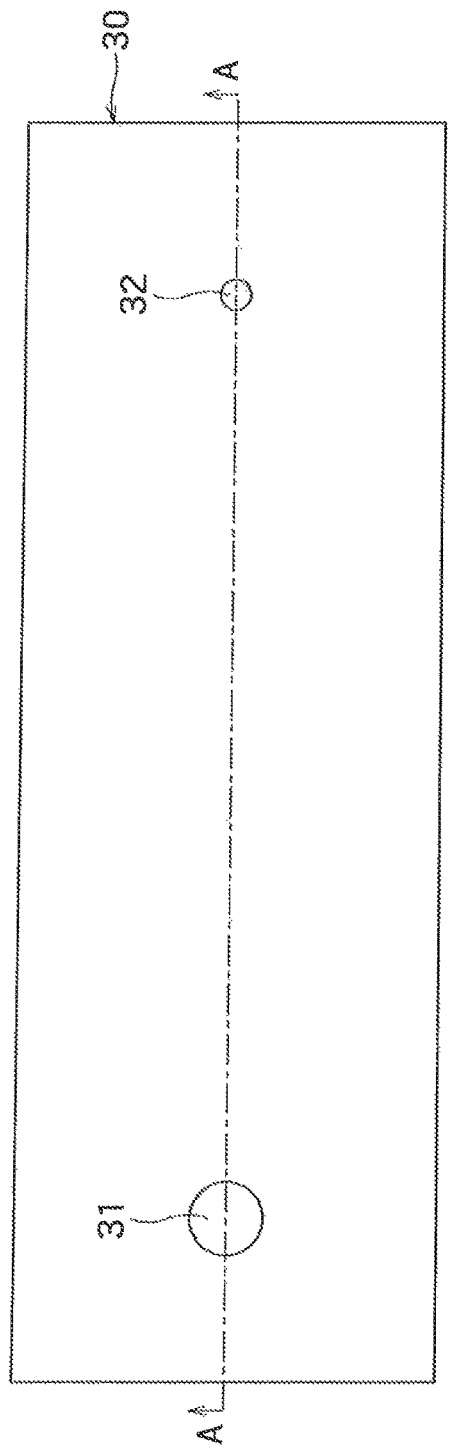
FIG. 2(a) is a plan view of the housing member 30.
Figure 2B:
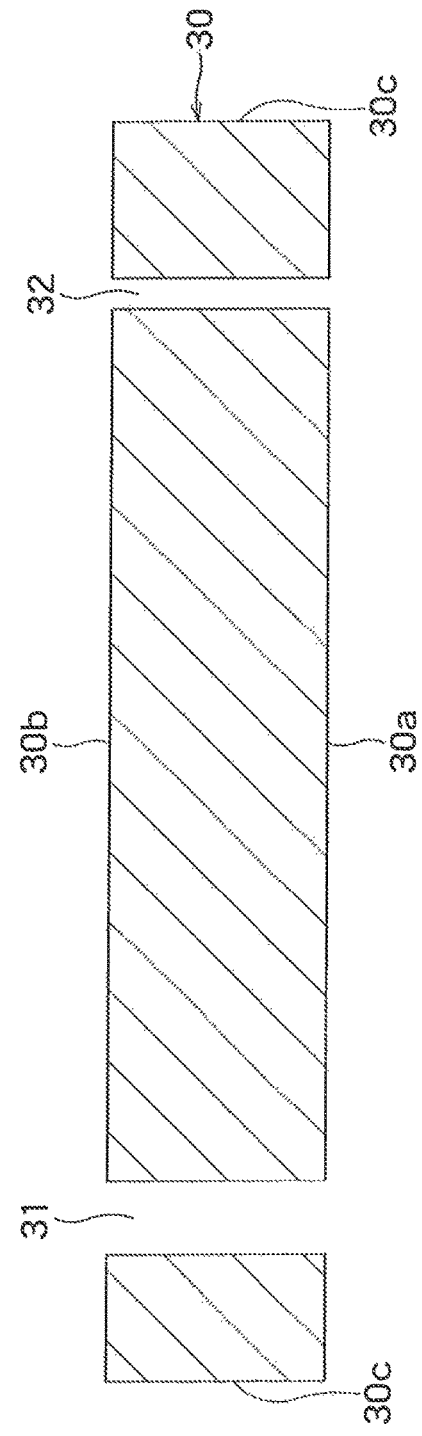
FIG. 2(b) is a cross-sectional view taken along the A-A line in FIG. 2(a).

Next, as illustrated in FIG. 1B(a), the housing member 30 is disposed on the protective film 6 (boring base material 19) such that the opening face 30a opposes the protective film 6 (housing member disposing process). By doing so, the conductive paste injecting channel 31 and the vacuum evacuating channel 32 are caused to communicate with the conductive paste flowing space S. Herein, the conductive paste flowing space S is a space defined by the bottomed via holes 7, 8 and 9, the conductive paste flowing groove 11 and the opening face 30a of the housing member 30.

More specifically, in this process, the housing member 30 is positioned relative to the boring base material 19, and after that, in a filling process, both are brought into close contact with each other for no leakage of conductive paste.

FIG. 1B(b) illustrates a partial plan view of the housing member 30 in the state where the housing member 30 is disposed on the protective film 6.

Notably, a mold releasing film (not shown) may also be provided between the housing member 30 and the protective film 6. In the mold releasing film, through holes are provided at the positions corresponding to the opening of the conductive paste injecting channel 31 and the opening of the vacuum evacuating channel 32, respectively.

In the present invention, in the cases where it is expressed that the housing member 30 is disposed on the protective film 6 such that the opening face 30a opposes the protective film 6, the case where the mold releasing film or the like is provided between the housing member 30 and the protective film 6 as mentioned above is also included.

Next, the conductive paste flowing space S is depressurized via the vacuum evacuating channel 32 (depressurizing process). The conductive paste flowing space S is depressurized, for example, at approximately 0.1 kPa using a vacuum pump or the like. The conductive paste flowing space S is depressurized, and thereby, air voids can be prevented from entering the inside of the conductive paste with which the bottomed via holes 7, 8 and 9 are filled.

Notably, since the dummy bottomed via hole 10 communicates with the conductive paste flowing space 8, the space in the dummy bottomed via hole 10 is also depressurized in the depressurizing process.

As compared with the case where the entire system including the boring base material 19 is evacuated using a conventional vacuum printer, time required for depressurizing is exceedingly short since the volume of the conductive paste flowing space S is extremely small.

Next, conductive paste 20 is injected or press-injected in the conductive paste flowing space S via the conductive paste injecting channel 31, and thereby, the bottomed via holes 7, 8 and 9 are filled with the conductive paste 20 (filling process). Herein, the conductive paste 20 is obtained by dispersing metal particles (copper particles, silver particles or the like) in resin binder which is paste-like thermosetting resin (epoxy or the like).

Notably, the conductive paste 20 adopts one with an appropriate viscosity. Preferably, it adopts one with the viscosity of the conductive paste 20 measured with a B-type rotational viscometer at 20 to 30° C. being 500 to 2000 dPa·sec. Although it is excellent in filling property in the case of the viscosity being less than 500 dPa·sec, it has a composition in which the conductive paste contains a volatile component. Due to this, there is a concern that the evacuation changes the state of the conductive paste, which may cause difficulty in constructing a stable process. On the other hand, in the case of the viscosity being larger than 2000 dPa·sec, the press-injection of the conductive paste is difficult.

Moreover, in the filling process, it is preferable that the conductive paste 20 that does not contain a volatile solvent is used. By doing so, the conductive paste 20 can be prevented from hardening under a reduced pressure and the protective film 6 (insulative film 5) can be made easily peeled off.

Moreover, in the filling process, it is preferable that conductive paste that shrinks less after thermosetting by heating processing in the integrating process mentioned later is used. By doing so, the flatness of the multi-layer printed circuit board can be prevented from being impaired, and the integrity of adhesion in the vicinity of the bottomed via holes and connection between the layers can be prevented from being impaired.

Moreover, during the filling process, it is preferable that pressure larger than the injection pressure (press-injection pressure) of the conductive paste 20 is exerted on the housing member 30 in the direction of the protective film 6 therefrom. By doing so, the housing member 30 can be brought into close contact with the protective film 6 under sufficient crimping pressure, and as a result, the conductive paste 20 can be prevented from leakage from between the housing member 30 and the protective film 6.

The conductive paste 20 injected into the conductive paste flowing space S through the conductive paste injecting channel 31 first flows in the bottomed via hole 7 to fill the bottomed via hole 7 as illustrated in FIG. 1C(1). After the filling of the bottomed via hole 7 is completed, the conductive paste 20 flows in the bottomed via hole 8 through the conductive paste flowing groove 11 that connects the bottomed via hole 7 and the bottomed via hole 8 to fill the bottomed via hole 8. Likewise, after that, the conductive paste 20 fills the bottomed via hole 9, and after that, flows in the dummy bottomed via hole 10 as illustrated in FIG. 1C(2).

At the time point when the conductive paste 20 flows in the dummy bottomed via hole 10, the injection of the conductive paste 20 is ended. In this way, the injection of the conductive paste 20 is stopped at the time point when the conductive paste 20 reaches the dummy bottomed via hole 10. Thereby, the conductive paste 20 can be prevented from flowing in the vacuum evacuating channel 32, which causes occlusion of the vacuum evacuating channel 32.

As mentioned above, in the filling process, the conductive paste 20 flows to move along the conductive paste flowing groove 11, filling the inside of the bottomed via holes sequentially from the bottomed via hole close to the opening part of the conductive paste injecting channel 31.

Timing of ending the injection of the conductive paste 20 may also be the time point of reaching a filling amount, where the filling amount corresponding to the volume of the conductive paste flowing space S is predetermined. Otherwise, the injection of the conductive paste 20 may also be ended at the time point of reaching a filling time, where the filling time with respect to a predetermined filling rate is predetermined based on the filling amount.

Notably, if the dummy bottomed via hole 10 that has a large volume is formed, a margin for the filling time of the conductive paste 20 can be increased.

After the filling process, the conductive paste flowing space S is released to the air, and after that, the housing member 30 is taken from the boring base material 19 as illustrated in FIG. 1D(1).

Next, as illustrated in FIG. 1D(2), the dummy bottomed via hole 10 is removed. Specifically, the dummy bottomed via hole 10 is removed by punching with a punch or the like or removed by cutting or the like of the region where the dummy bottomed via hole 10 is formed.

In this way, the dummy bottomed via hole 10 is removed. Thereby, the flatness of the multi-layer printed circuit board can be prevented from being impaired, and the integrity of adhesion in the vicinity of the dummy bottomed via hole 10 and connection between the layers can be prevented from being impaired, which are caused by thermal expansion of the air in the dummy bottomed via hole 10 during the heating processing in the integrating process mentioned later.

Through the processes above, a wiring base material 25A illustrated in FIG. 1D(2) is obtained.

Next, as illustrated in FIG. 1D(3), the protective film 6 of the wiring base material 25A is peeled off such that the adhesive layer 4 remains in the wiring base material 25A. By doing so, parts of conductive paste 21, 22, 23 with which the bottomed via holes 7, 8 and 9 are filled are caused to protrude. The parts of conductive paste 21, 22, 23 which parts protrude from the adhesive layer 4 become projecting parts 21a, 22a and 23a. The height of the projecting parts 21a, 22a and 23a is approximately equal to the thickness of the insulative film 5. Notably, the conductive paste 20 in the conductive paste flowing groove 11 is removed along with the insulative film 5 by the peeling-off of the insulative film 5.

Through the processes above, a wiring base material 25 illustrated in FIG. 1D(3) is obtained.

Next, through the processes similar to the above, a wiring base material 26 illustrated in FIG. 1E(1) is manufactured. One of its differences from the manufacturing method of the wiring base material 25 is in the configuration of the protective film 6 provided on the principal surface 1a of the metal foil clad laminated sheet 3. The protective film 6 used for manufacturing the wiring base material 26 is obtained by forming an adhesive layer (for example, with a thickness of 10 μm) having slight adhesion on one surface of an insulative film (for example, a PET film with a thickness of 20 μm). The adhesive layer with slight adhesion is peeled off along with the insulative film 5 from the insulative base material 1 in peeling off the protective film 6.

In manufacturing the wiring base material 26, the protective film having the adhesive layer with slight adhesion as above is pasted on the principal surface 1a of the metal foil clad laminated sheet 3. Then, in peeling off the protective film 6, the protective film 6 is peeled off along with the adhesive layer with slight adhesion. Therefore, as illustrated in FIG. 1E(1), the projecting parts 21a, 22a and 23a of the wiring base material 26 are in the state of protruding from the insulative base material 1. The height of the projecting parts 21a, 22a and 23a of the wiring base material 26 is approximately equal to the thickness of the protective film 6.

Notably, in the boring process of the wiring base material 26, it is preferable that the diameter of the bottomed via holes 7, 8 and 9 is formed to be larger than the diameter of the bottomed via holes 7, 8 and 9 of the wiring base material 25. For example, in contrast to the diameter of the bottomed via holes 7, 8 and 9 of the wiring base material 25 being ϕ150 μm, the diameter of the bottomed via holes 7, 8 and 9 of the wiring base material 26 is set to be ϕ200 μm. By doing so, a positioning margin in laminating the wiring base material 25 and the wiring base material 26 can be large.

Next, as illustrated in FIG. 1E(1), the wiring base material 25 and the wiring base material 26 are laminated such that their projecting parts of the conductive paste come into contact with each other. The laminated wiring base material 25 and wiring base material 26 (hereinafter also referred to simply as "laminate") is heated to be integrated (integrating process). In this process, the adhesive layer 4 thermosets and the metal particles of the conductive paste 20 make metal bonding to one another and make metal bonding also to the metal foil 2. More in detail, the integrating process is performed as follows.

First, the wiring base material 25 and the wiring base material 26 are caused to oppose each other to perform positioning. The wiring base material 25 and the wiring base material 26 are laminated such that the projecting parts 21a, 22a and 23a of the wiring base material 25 come into contact with the projecting parts 21a, 22a and 23a of the wiring base material 26, respectively.

The integration of the laminated wiring base material 25 and wiring base material 26 is performed specifically using a vacuum pressing apparatus or a vacuum laminator apparatus. Using any of these apparatuses, for example, the laminate is heated at a laminating process temperature of approximately 200° C. and pressed under a pressure of approximately several MPa. Notably, the laminating process temperature is lower than the softening temperature of the liquid crystal polymer by 50° C. or more.

In the case of using the vacuum pressing apparatus, for example, the laminate is held under the above-mentioned heating and pressing conditions for approximately 30 minutes to 60 minutes. By doing so, the thermosetting of the adhesive layer 4 and the thermosetting of the binder resin of the conductive paste 21, 22, 23 are completed.

In the case of using the vacuum laminator apparatus, heating and pressing time is several minutes, and at the end time point, the thermosetting reaction has not been completed yet. Due to this, the laminate is transferred from the vacuum laminator apparatus to an oven apparatus to perform post-cure processing. In the post-cure processing, the laminate is heated, for example, at a temperature around 200° C. for approximately 60 minutes. By doing so, the thermosetting of the adhesive layer 4 and the thermosetting of the binder resin of the conductive paste 21, 22, 23 are completed, In any of the cases of using the vacuum pressing apparatus and the vacuum laminator apparatus, heating at the predetermined laminating process temperature allows the metal particles contained in the conductive paste 21, 22, 23 to make metal bonding to one another and make metal bonding to the metal foil 2. By doing so, as illustrated in FIG. 1E(2), conductive vias 24 for inter-layer connection are formed.

Notably, preferably, conductive paste containing low melting point metal (In, SnIn, SnBi or the like), which is contained in low melting point solder, or low melting point alloy is used in order to allow the metal particles contained in the conductive paste to make metal bonding to one another at the laminating process temperature of approximately 200° C.

Moreover, preferably, the melting point of the metal particles contained in the conductive paste is not more than the laminating process temperature. Examples of such low melting point metal include In, SnIn and SnBi. In the filling process, preferably, conductive paste containing metal particles made of any of these low melting point metals is used.

Moreover, preferably, when the metal foil 2 is a copper foil, in the filling process, conductive paste containing Sn, Zn, Al, Ag, Ni, Cu or alloy of these is used. By doing so, the heating at the laminating process temperature (for example, approximately 200° C.) allows the metal particles contained in the conductive paste to form an alloy layer with the copper foil.

Next, as illustrated in FIG. 1E(2), the metal foils 2 on the outsides of the wiring base material 25 and the wiring base material 26 undergo patterning to form a wiring pattern 27 and a wiring pattern 28. The patterning of the metal foils 2 is performed, for example, by etching using a known photo fabrication technique.

Notably, simultaneous exposure on both surfaces may also be performed, so that the metal foil 2 of the wiring base material 25 and the metal foil 2 of the wiring base material 26 simultaneously undergo the patterning. By doing so, the positioning between the wiring pattern 27 and the wiring pattern 28 can be performed at higher accuracy than the positioning accuracy (laminating accuracy) in laminating the wiring base material 25 and the wiring base material 26.

Through the processes above, as illustrated in FIG. 1E(2), a multi-layer printed circuit board 29 in which conductive vias 24 electrically connecting the wiring pattern 27 and the wiring pattern 28 together are provided is obtained.

After that, formation of a cover lay and a solder resist layer, surface processing of land parts of the wiring patterns 27 and 28 (gold plating or the like), outline processing, and the like are performed as needed.

Notably, the thickness of the insulative film 5 is to define the height of the projecting parts 21a, 22a and 23a of the conductive paste 21, 22, 23 (namely, a projecting amount of the conductive paste). Therefore, when the insulative film 5 is too thick, there is a concern that the projecting parts 21a, 22a and 23a protrude too much, the adhesive layer 4 cannot absorb roughness of the multi-layer printed circuit board 29 in the integrating process, and the flatness of the multi-layer printed circuit board 29 is impaired. On the other hand, when the insulative film 5 is too thin, there is a concern that the projecting parts 21a, 22a and 23a are too low, and connection reliability of the conductive vias 24 cannot be sufficiently secured, which is caused by weak crimping between pieces of the conductive paste (for example, the conductive paste 21 of the wiring base material 25 and the conductive paste 21 of the wiring base material 26) even under pressing the laminate of the wiring base materials in the integrating process. Accordingly, it is preferable that the thickness of the insulative film 5 is in a range of 25±5 μm.

Moreover, the patterning of the metal foils 2 may also be performed before the integrating process.

As described above, in the present embodiment, the housing member 30 is disposed on the protective film 6 of the boring base material 19, and the conductive paste injecting channel 31 and the vacuum evacuating channel 32 are caused to communicate with the conductive paste flowing space S. After that, the conductive paste flowing space S is depressurized, and in this state, the conductive paste 20 is injected into the conductive paste flowing space S via the conductive paste injecting channel 31 of the housing member 30.

According to the present embodiment, the conductive paste 20 is injected in the state where the conductive paste flowing space S is depressurized. Thereby, air voids can be prevented from entering the inside of the conductive paste 21, 22, 23 with which the bottomed via holes 7, 8 and 9 are filled.

Furthermore, according to the present embodiment, only the conductive paste flowing space S is sufficient to be locally depressurized. Hence, a vacuum printer is not needed, which allows simple performance and low manufacturing costs.

Furthermore, according to the present embodiment, only the conductive paste flowing space S is sufficient to be locally depressurized. Hence, as compared with the case where the entire system containing the printed circuit board is depressurized using a vacuum printer, time required for the depressurizing process can be exceedingly reduced, which enables productivity to be improved.

Exemplarily presenting actual values as a reference, when the filling with the conductive paste was performed with respect to the boring base material in which 300 bottomed via holes (φ150 μm) were formed, the filling with the conductive paste was completed in about 10 seconds. The length of the boring base material used was about y 10 cm and the distance between the bottomed via holes was about 1 mm. Notably, in the case where a conventional vacuum printer is used, time required from evacuation of the system to the end of printing is approximately 3 minutes.

Moreover, according to the present embodiment, as compared with conventional screen printing under a vacuum environment, printing loss is small, which enables the waste amount of the conductive paste to be reduced. By doing so, the product use rate of the expensive conductive paste can be improved, which enables manufacturing costs to be reduced.

Moreover, according of the present embodiment, the entire system containing the printed circuit board is not needed to be evacuated. Hence, in manufacturing flexible printed circuit boards, the filling process can be performed in the so-called roll-to-roll scheme. By doing so, the productivity can be further improved.

Moreover, a plurality of housing members may also be disposed on one boring base material (or a worksheet containing a plurality of products) to perform the filling with the conductive paste in parallel. By doing so, time required for the filling process can be further reduced.

Moreover, the dummy bottomed via hole 10 is formed in the boring base material 19. Thereby, the vacuum evacuating channel 32 can be prevented from being occluded with the conductive paste 20, which enables reliability of the filling process to be improved.

Notably, while, in the present embodiment, the conductive paste flowing groove 11 is formed in the protective film 6, a similar groove may also be formed in the housing member 30. It should be noted that versatility of the housing member 30 can be enhanced more when the conductive paste flowing groove 11 is formed in the protective film 6. In other words, the common housing member 30 is applicable with respect to products same in injection position of the conductive paste (opening position of the conductive paste injecting channel 31) and in vacuum evacuation position (opening position of the vacuum evacuating channel 32), regardless of arrangement of the bottomed via holes. Providing the conductive paste flowing groove 11 in the protective film 6 enables one type of housing member to be compatible with versatile boring base materials.

Furthermore, providing the conductive paste flowing groove 11 in the protective film 6 also leads to a merit that highly accurate positioning is not needed when the housing member 30 is disposed on the protective film 6.

Moreover, if the conductive paste flowing groove is not provided in the housing member 30, residue of the conductive paste hardly sticks to the housing member 30, which enables the next filling process to be prevented from being adversely affected.

Notably, as the number of the bottomed via holes formed in the boring process increases (for example, hundreds to thousands), appropriate control of the filling time and the injection pressure of the conductive paste becomes difficult. Therefore, it can be considered that the conductive paste flowing groove 11 is formed in a traversable manner.

Figure 3:
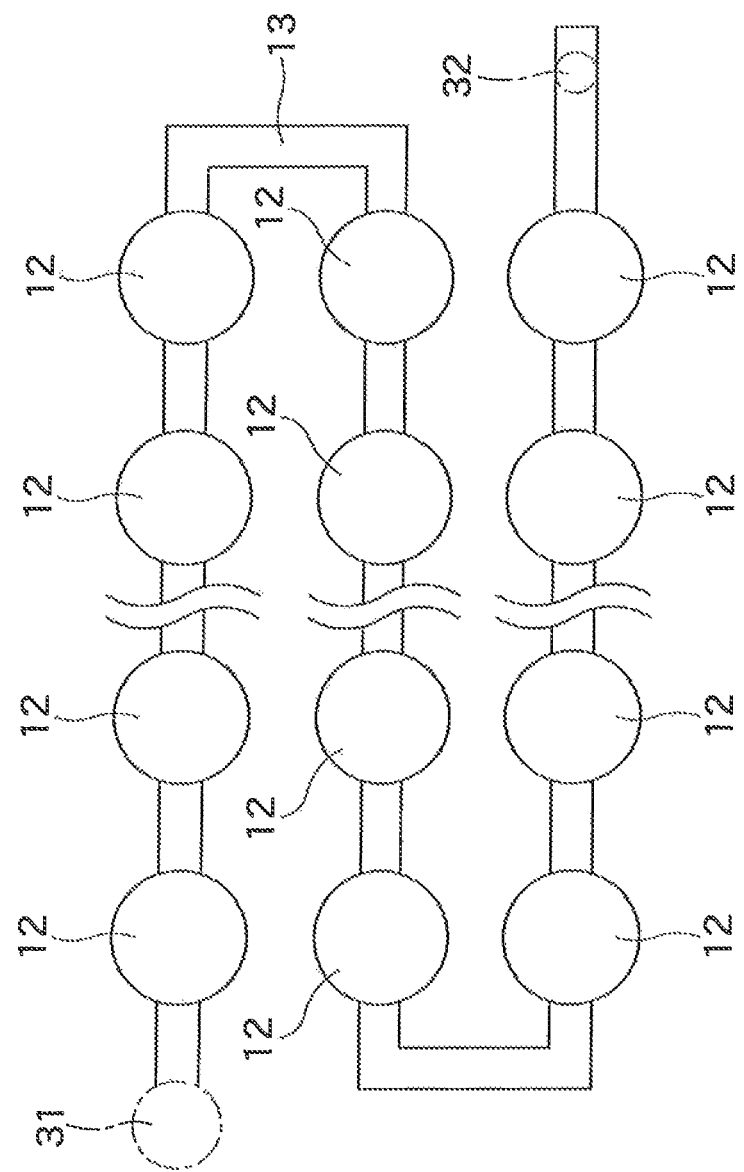
FIG. 3 is a plan view illustrating a conductive paste flowing groove 13 formed in a traversable manner so as to pass through a plurality of bottomed via holes 12.

Namely, preferably, as illustrated in FIG. 3, when a plurality of bottomed via holes 12 are formed in the boring process, a conductive paste flowing groove 13 is formed in a traversable manner in the groove forming process such that it passes through the plurality of bottomed via holes 12 one-by-one. By doing so, the path from the injection of the conductive paste 20 to the vacuum evacuation has a shape not having a branch or a junction. Due to this, even when the number of the bottomed via holes is large, various control parameters of the filling process (filling time, filling rate, injection pressure and the like) can be relatively easily determined based on the number of conduction holes 12 and the length of the conductive paste flowing groove 13. Moreover, forming the conductive paste flowing groove in a traversable manner as above enables timing of ending the filling process to be easily grasped.

Figure 4:
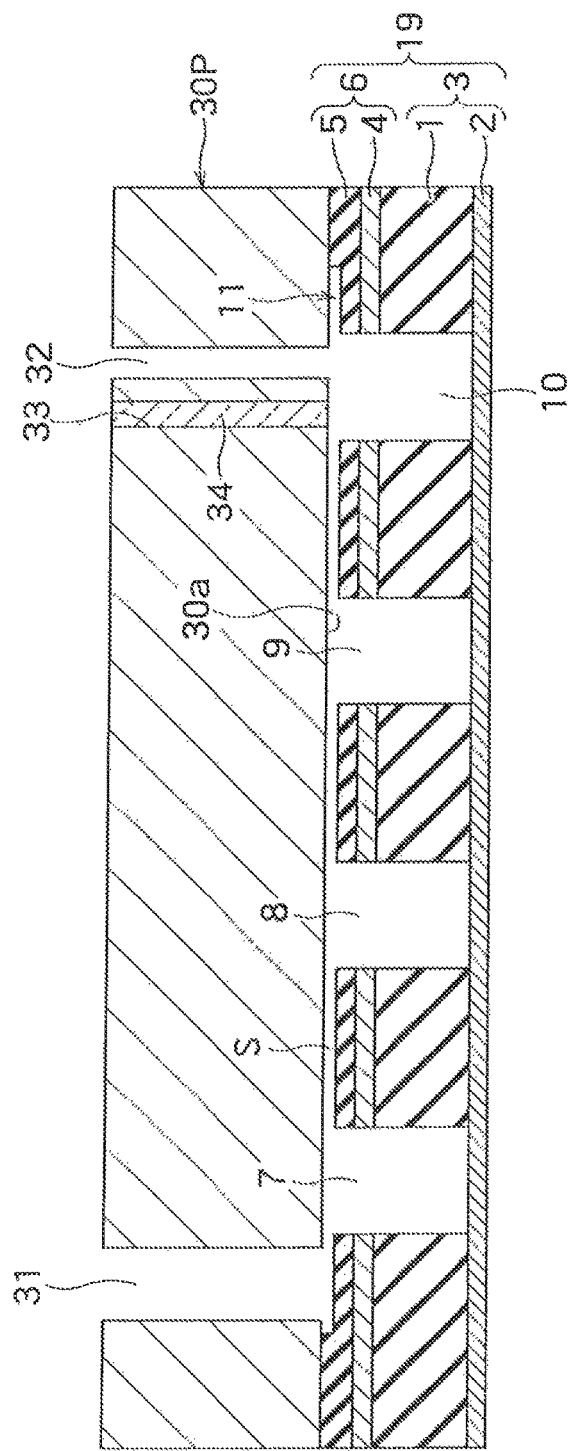
FIG. 4(a) is a cross-sectional view illustrating the state where a housing member 30P in which a transparent material 34 is hermetically fitted into a monitoring through hole 33 is disposed on the protective film 6.
FIG. 4(b) is a partial plan view of the housing member 30P.
Figure 4:
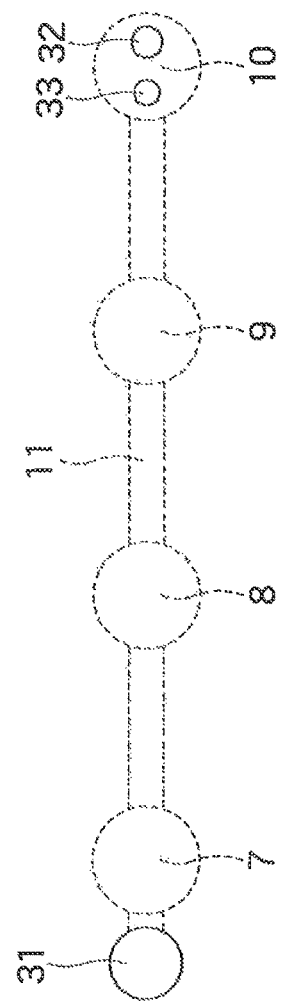

Moreover, preferably, a window through which the dummy bottomed via hole 10 can be visually confirmed from the housing member 30 is provided. More in detail, in the housing member preparing process, a housing member 30P illustrated in FIGS. 4(a) and 4(b) is prepared. A monitoring through hole 33 is provided in the housing member 30P. A transparent material 34 such as glass or transparent resin is hermetically fitted into the monitoring through hole 33.

Herein, as illustrated in FIG. 4(a), the monitoring through hole 33 is provided such that its one end opens on the opening face 30a that is positioned above the dummy bottomed via hole 10, and it penetrates the housing member 30P in the thickness direction of the metal foil clad laminated sheet 3 in the state where the housing member 30P is disposed on the protective film 6.

Then, in the filling process, the injection of the conductive paste 20 is to be ended at the time point when it is detected, via the monitoring through hole 33, that the conductive paste 20 flows in the dummy bottomed via hole 10.

In this way, the window for monitoring the situation of the dummy bottomed via hole 10 is provided in the housing member. Thereby, timing when the conductive paste 20 reaches the dummy bottomed via hole 10 can be easily perceived.

Figure 5A:
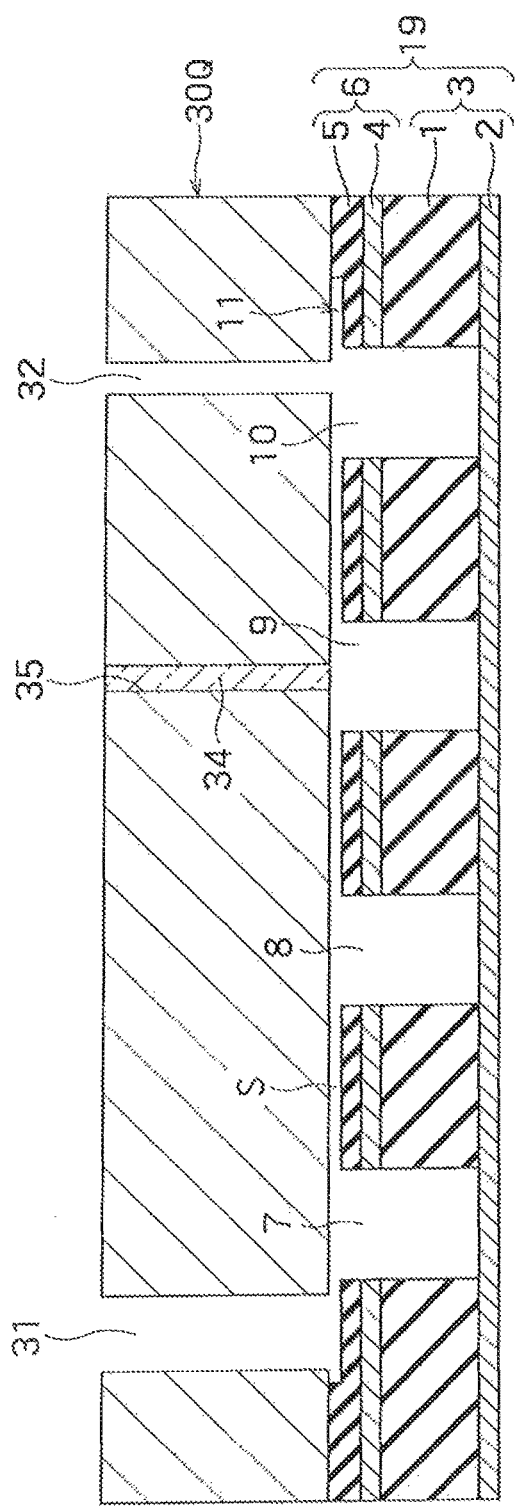
FIG. 5(a) is a cross-sectional view illustrating the state where a housing member 30Q in which the transparent material 34 is hermetically fitted into a monitoring through hole 35 is disposed on the protective film 6.
Figure 5B:
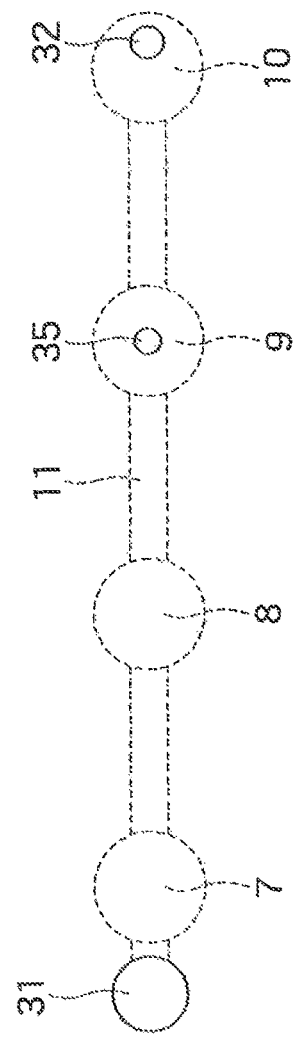
FIG. 5(b) is a partial plan view of the housing member 30Q.

Notably, a window for monitoring the situation of the bottomed via hole may also be provided in the housing member. As illustrated in FIGS. 5(a) and 5(b), a monitoring through hole 35 is provided in a housing member 30Q. The transparent material 34 such as glass or transparent resin is hermetically fitted into the monitoring through hole 35.

Herein, as illustrated in FIG. 5(a), the monitoring through hole 35 is provided such that its one end opens on the opening face 30a that is positioned above the bottomed via hole 9, and it penetrates the housing member 30Q in the thickness direction of the metal foil clad laminated sheet 3 in the state where the housing member 30Q is disposed on the protective film 6.

Then, in the filling process, the injection of the conductive paste 20 is to be ended at the time point when it is detected, via the monitoring through hole 35, that the bottomed via hole 9 is filled with the conductive paste 20. By doing so, timing when the injection of the conductive paste 20 is ended can be easily determined.

Notably, a window for monitoring may also be provided in the housing member so as to be positioned above the conductive paste flowing groove 11 that joins the bottomed via hole 9 and the dummy bottomed via hole 10 together.

Moreover, the metal foil clad laminated sheet 3 may also be a double-sided metal foil clad laminated sheet having the metal foils 2 provided on both surfaces of the insulative base material 1. In this case, the metal foil 2 on one surface undergoes patterning to beforehand form annular masks for boring processing and receiving lands. After that, the protective film 6 is provided on the principal surface of the insulative base material 1 so as to cover the metal foil 2 having undergone the patterning.

Figure 6:
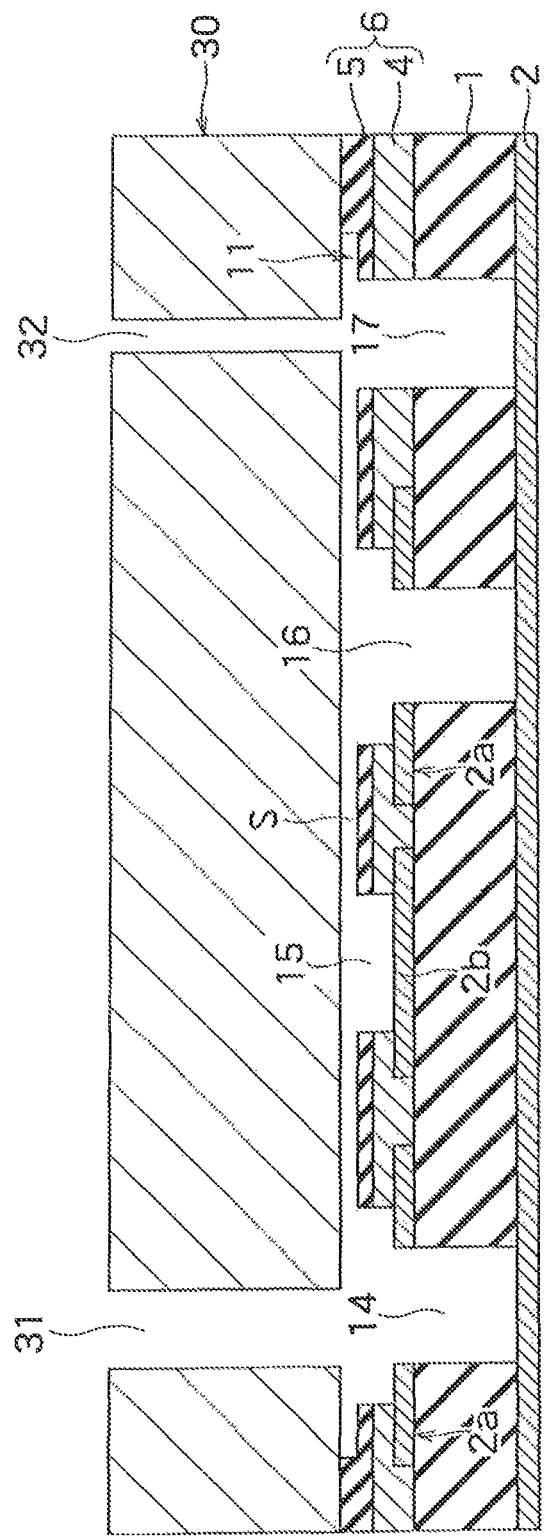
FIG. 6 is a process cross-sectional view for explaining the filling method of conductive paste in the case of using a double-sided metal foil clad laminated sheet.

After that, as illustrated in FIG. 6, the protective film 6 and the insulative base material 1 are partially removed thereby to form bottomed via holes 14, 15 and 16 having the metal foil exposed on their bottom faces. In this stage, a dummy bottomed via hole 17 may also be formed.

Each of the bottomed via holes 14 and 16 is a bottomed via hole obtained by processing into a step shape with a mask 2a for boring processing which mask is composed of the metal foil 2 having undergone the patterning. The bottomed via hole 15 is a shallow bottomed via hole having a receiving land 2b composed of the metal foil 2 which has undergone the patterning exposed on its bottom face.

The processes including and after the succeeding filling process are similar to the above-mentioned processes and omitted. As above, according to the present invention, various types of bottomed via holes can be filled with conductive paste.

While, based on the above description, the skilled in the art may be able to envision various modifications and additional effects of the present invention, aspects of the present invention are not intended to be limited to the embodiments described above. Additions, modifications and partial elimination are possible in a variety of ways without departing from the scope and spirit of the invention derived from the contents as defined in the appended claims and their equivalents.

REFERENCE SIGNS LIST

1 Insulative base material
1a and 1b Principal surfaces
2 Metal foil
2a Mask for boring processing
2b Receiving land
3 Metal foil clad laminated sheet
4 Adhesive layer
5 Insulative film
6 Protective film
7, 8, 9, 12, 14, 15 and 16 Bottomed via holes
10 and 17 Dummy bottomed via holes
11 and 13 Conductive paste flowing grooves
19 Boring base material
20 Conductive paste 21, 22 and 23 Conductive paste (with which the bottomed via holes are filled)
21a, 22a and 23a Projecting parts
24 Conductive via
25, 25A and 26 Wiring base materials
27 and 28 Wiring patterns
29 Multi-layer printed circuit board
30, 30P and 30Q Housing members
30a Opening face
30b Upper face
30c Lateral face
31 Conductive paste injecting channel
32 Vacuum evacuating channel
33 and 35 Monitoring through holes
34 Transparent material
S Conductive paste flowing space

The invention claimed is:

1. A filling method of conductive paste, comprising:
a process of preparing a metal foil clad laminated sheet having an insulative base material having a first principal surface and a second principal surface opposite to the first principal surface and a metal foil provided on the second principal surface of the insulative base material;
a process of providing a protective film on the first principal surface of the metal foil clad laminated sheet;
a boring process of partially removing the protective film and the insulative base material, and thereby, forming a bottomed via hole having the metal foil exposed on its bottom face;
a groove forming process of removing the protective film from a surface to a midway thereof to form a conductive paste flowing groove having the bottomed via hole exposed on its bottom face;
a housing member preparing process of preparing a housing member in which a conductive paste injecting channel and a vacuum evacuating channel are provided and has an opening face on which one end of each of the conductive paste injecting channel and the vacuum evacuating channel opens;
a housing member disposing process of disposing the housing member on the protective film such that the opening face opposes the protective film, and thereby, causing the conductive paste injecting channel and the vacuum evacuating channel to communicate with a conductive paste flowing space defined by the bottomed via hole, the conductive paste flowing groove and the opening face of the housing member;
a process of depressurizing the conductive paste flowing space via the vacuum evacuating channel;
a filling process of injecting conductive paste into the conductive paste flowing space via the conductive paste injecting channel, and thereby, filling an inside of the bottomed via hole with the conductive paste; and
a process of peeling off the protective film with the conductive paste flowing groove on its surface to remain the conductive paste in the bottomed via hole and to cause part of the conductive paste with which the bottomed via hole is filled to protrude, wherein
in the boring process, a plurality of the bottomed via holes are formed, and
in the groove forming process, the conductive paste flowing groove is formed so as to join the plurality of bottomed via holes.

2. The filling method of conductive paste according to claim 1, wherein
during the filling process, pressure larger than injection pressure of the conductive paste is exerted with respect to the housing member in a direction of the protective film.

3. The filling method of conductive paste according to claim 1, further comprising
a process of partially removing the protective film and the insulative base material, and thereby, forming a dummy bottomed via hole, the dummy bottomed via hole communicating with the conductive paste flowing space and positioned between the bottomed via hole and the vacuum evacuating channel in a state where the housing member is disposed on the protective film, wherein
in the filling process, injection of the conductive paste is ended at a time point when the conductive paste flows in the dummy bottomed via hole.

4. The filling method of conductive paste according to claim 3, wherein
in the housing member preparing process,
the housing member is prepared in which a monitoring through hole whose one end opens on an opening face positioned above the dummy bottomed via hole in a state where the housing member is disposed on the protective film and which penetrates the housing member in a thickness direction of the metal foil clad laminated sheet is provided, a transparent material being hermetically fitted into the monitoring through hole, and
in the filling process,
the injection of the conductive paste is ended at a time point when it is detected that the conductive paste flows in the dummy bottomed via hole via the monitoring through hole.

5. The filling method of conductive paste according to claim 1, wherein
in the housing member preparing process,
the housing member is prepared in which a monitoring through hole whose one end opens on an opening face positioned above the bottomed via hole in a state where the housing member is disposed on the protective film and which penetrates the housing member in a thickness direction of the metal foil clad laminated sheet is provided, a transparent material being hermetically fitted into the monitoring through hole, and
in the filling process,
injection of the conductive paste is ended at a time point when it is detected that an inside of the bottomed via hole is filled with the conductive paste via the monitoring through hole.

6. The filling method of conductive paste according to claim 1, wherein
viscosity of the conductive paste at 20 to 30° C. is 500 to 2000 dPa·sec.

7. The filling method of conductive paste according to claim 1, wherein
in the filling process, a conductive paste that does not contain a volatile solvent is used.

8. The filling method of conductive paste according to claim 1, wherein
in the groove forming process, the conductive paste flowing groove is formed in a traversable manner so as to pass through the plurality of bottomed via holes one-by-one, and
the conductive paste flowing groove has a shape without a branch or a junction entirely from one end corresponding to the conductive paste injecting channel to another end corresponding to the vacuum evacuating channel.

\* \* \* \* \*